(12) United States Patent
Liu et al.

(10) Patent No.: US 12,411,259 B2
(45) Date of Patent: Sep. 9, 2025

(54) PHASE-CONTROLLED EXCITATION DOWNHOLE NUCLEAR MAGNETIC RESONANCE IMAGING DEVICE AND METHOD

(71) Applicant: Institute of Geology and Geophysics, Chinese Academy of Sciences, Beijing (CN)

(72) Inventors: Wei Liu, Beijing (CN); Wenxiu Zhang, Beijing (CN); Wenxuan Chen, Houston, TX (US)

(73) Assignee: Institute of Geology and Geophysics, Chinese Academy of Sciences, Beijing (CN)

( * ) Notice: Subject to any disclaimer, the term of this patent is extended or adjusted under 35 U.S.C. 154(b) by 141 days.

(21) Appl. No.: 18/488,752

(22) Filed: Oct. 17, 2023

(65) Prior Publication Data

US 2025/0076530 A1    Mar. 6, 2025

(30) Foreign Application Priority Data

Sep. 5, 2023 (CN) .......................... 202311137281.0

(51) Int. Cl.
*G01V 3/32* (2006.01)
*G01R 33/36* (2006.01)

(52) U.S. Cl.
CPC ........... *G01V 3/32* (2013.01); *G01R 33/3621* (2013.01)

(58) Field of Classification Search
CPC ................................................ G01R 33/3621
See application file for complete search history.

(56) References Cited

U.S. PATENT DOCUMENTS 6,522,137 B1 * 2/2003 Sun ...................... G01N 24/081
 324/303
8,860,413 B2 * 10/2014 Hopper .............. G01R 33/3808
 324/303

(Continued)

FOREIGN PATENT DOCUMENTS

CN      1063139 A     7/1992
CN    105473813 A     4/2016

(Continued)

*Primary Examiner* — Gregory H Curran
(74) *Attorney, Agent, or Firm* — Seed IP Law Group LLP

(57) ABSTRACT

The present disclosure provides a phase-controlled excitation downhole nuclear magnetic resonance imaging device and method which relate to the technical fields of downhole nuclear magnetic resonance imaging devices and methods, and achieve high-resolution imaging for an underground target by utilizing a plurality of array antenna units and a phase-controlled array technology. The array antenna units are uniformly arranged around an array antenna frame, and each antenna unit is capable of achieving independent transmission and collection. A transmission phase of each antenna unit is controlled by adopting a phase control technology, the positioning excitation of a transmission pulse is achieved according to a co-phase stacking principle, and thus, the imaging resolution is further improved. The present disclosure has the advantages of high resolution and high efficiency and is suitable for the field of underground exploration. The application of this method will provide a more accurate and reliable imaging result for underground exploration and provide an important technical support for resource exploration and development.

3 Claims, 1 Drawing Sheet

(56) References Cited

U.S. PATENT DOCUMENTS

| 10,191,178 B2 * | 1/2019 | Xiao .................. G01V 3/32 |
| 2017/0010380 A1 | 1/2017 | Reiderman |
| 2023/0112374 A1 | 4/2023 | Naveena-Chandran |

FOREIGN PATENT DOCUMENTS

| CN | 108590629 A | 9/2018 |
| CN | 113721174 A | 11/2021 |
| CN | 114252928 A | 3/2022 |
| CN | 115494102 A | 12/2022 |

* cited by examiner

PHASE-CONTROLLED EXCITATION DOWNHOLE NUCLEAR MAGNETIC RESONANCE IMAGING DEVICE AND METHOD

TECHNICAL FIELD

The present disclosure relates to the technical fields of downhole nuclear magnetic resonance imaging devices and methods, in particular to a phase-controlled excitation downhole nuclear magnetic resonance imaging device and method.

BACKGROUND ART

A nuclear magnetic resonance logging instrument logs formation conditions around an oil well according to the principle of nuclear magnetic resonance, thereby detecting information related to oil and gas characteristics in a formation. The nuclear magnetic resonance logging instrument mainly forms a magnetic field through a probe and collects a resonance signal, then, analyzes a fluid existing in pores of formation rocks according to the resonance signal to directly measure the density of hydrogen nuclei in the fluid in a reservoir, can directly convert nuclear magnetic data obtained by means of the nuclear magnetic resonance signal into an apparent water-filled porosity; and can also determine the existence, content and fluid related characteristics of different fluids in the reservoir.

The nuclear magnetic resonance logging instrument is developed with nuclear magnetic resonance methods and different application backgrounds. A system of the nuclear magnetic resonance logging instrument may be functionally divided into a sensor, an electronic circuit and upper computer software. The sensor consists of a magnet and an antenna, the magnet generates a static magnetic field Bo to polarize protons in a sample, and the antenna is used to generate an alternating electromagnetic field BI perpendicular to the direction of the static magnetic field (known as a radio-frequency magnetic field due to an operating frequency within a radio frequency band range), generate a nuclear magnetic resonance phenomena and receive a nuclear magnetic resonance signal. A downhole nuclear magnetic resonance imaging is an imaging technology for exploring underground resources and analyzing a fluid in pores of a reservoir. Traditional underground exploration methods such as seismic exploration and electromagnetic exploration have some limitations, while the downhole nuclear magnetic resonance imaging technology can provide a more accurate and high-resolution underground imaging result. During the exploration of the underground resources, the nuclear magnetic resonance imaging technology has been widely applied. However, a traditional nuclear magnetic resonance imaging method cannot achieve 360° high-resolution nuclear magnetic resonance imaging excitation around the well, which limits its application in downhole exploration.

SUMMARY OF THE INVENTION

In order to solve the above-mentioned technical problems, the present disclosure provides a phase-controlled excitation downhole nuclear magnetic resonance imaging device and method, which achieve high-resolution imaging for an underground structure by means of characteristics of downhole drilling equipment and by utilizing a plurality of array antenna units and a phase-controlled array technology. The core concept of the present disclosure is to utilize a static magnetic field formed by a magnet of a downhole conventional nuclear magnetic resonance logging instrument and apply an excitation magnetic field through the array antenna units and a global antenna mounted around the instrument to excite a nuclear magnetic resonance signal in an underground reservoir. At the same time, the array antenna units and the global antenna mounted on the instrument can be used as receiving coils to receive the nuclear magnetic resonance signal in the underground reservoir.

In order to achieve the above-mentioned objectives, the present disclosure adopts the following technical solutions:
provided is a phase-controlled excitation downhole nuclear magnetic resonance imaging device, including cylindrical antenna systems, an array antenna carrier, a slurry channel, a device frame, array antenna units, and a global antenna: the cylindrical antenna systems being uniformly arranged around a downhole nuclear magnetic resonance logging instrument and having the array antenna units equidistantly and uniformly distributed thereon: each array antenna unit being capable of achieving independent transmission and collection: the device frame being a cylindrical rod-like body made of a non-magnetic material, the center of an axis of the device frame being hollowed to form the slurry channel, the array antenna carrier being tightly wrapped at the periphery of the device frame, the inside of the array antenna carrier being provided with uniformly-distributed cavities for inserting the cylindrical antenna systems; and the array antenna units being assembled on the cylindrical antenna systems in a winding manner, and the global antenna being spirally wound on the array antenna carrier.

The present disclosure further provides a phase-controlled excitation downhole nuclear magnetic resonance imaging method, including a fixed-point excitation mode and a directional collection mode:
in the fixed-point excitation mode, position points where a nuclear magnetic resonance phenomenon occurs around the nuclear magnetic resonance imaging device being achieved by controlling different phases of transmission pulses of the array antenna units uniformly arranged on the cylindrical antenna systems, the collection of signals on the position points being achieved by means of the global antenna, the array antenna units being controlled by a phase control technology to transmit pulse signals of the different phases, and fixed-point nuclear magnetic resonance excitation being achieved on a set position by stacking the pulse transmission phases of the plurality of array antenna units, so that nuclear magnetic resonance data of each position point is obtained, and nuclear magnetic resonance imaging around a well is achieved; and
in the directional collection mode, a global excitation area being excited by adopting the global antenna to generate a nuclear magnetic resonance phenomena, echo signals being collected by using the array antenna units, and a weight of a detected signal in a receiving direction of each array antenna unit being recognized according to position information of the array antenna units arranged on the cylindrical antenna systems, so that the directional collection mode for imaging measurement is achieved.

The present disclosure can adapt to complex downhole environmental conditions including high temperature, high pressure, strong vibration, etc. Moreover, by means of the processing that the echo signals are collected by the array antenna units, three-dimensional nuclear magnetic resonance imaging of a fluid in a reservoir is achieved, the measurement of a structure of an underground reservoir and properties of the fluid can be achieved, and more timely and accurate information can be provided for geological survey and resource exploration.

Beneficial Effects by utilizing a phase-controlled excitation technology in the present disclosure, a high-resolution nuclear magnetic resonance imaging result can be obtained, and more accurate evaluation information on the underground reservoir can be provided. The present disclosure can monitor the distribution of the fluid in the reservoir and is of great significance for underground resource exploration and environmental monitoring. By using the phase-controlled excitation downhole nuclear magnetic resonance imaging method in the present disclosure, it is unnecessary to sample a formation core; and the method can be used in nuclear magnetic resonance logging while drilling to avoid destroying an undisturbed formation and also reduce the exploration cost. This method is suitable for fields such as oil exploration and groundwater resource survey.

The present disclosure achieves high-resolution imaging for an underground target by utilizing the plurality of antenna units and the phase-controlled array technology: Compared with a traditional single-detector method, the present disclosure has higher imaging quality and exploration efficiency. The present disclosure has the advantages of high resolution and high efficiency, and is suitable for the field of underground exploration.

Figure 1:
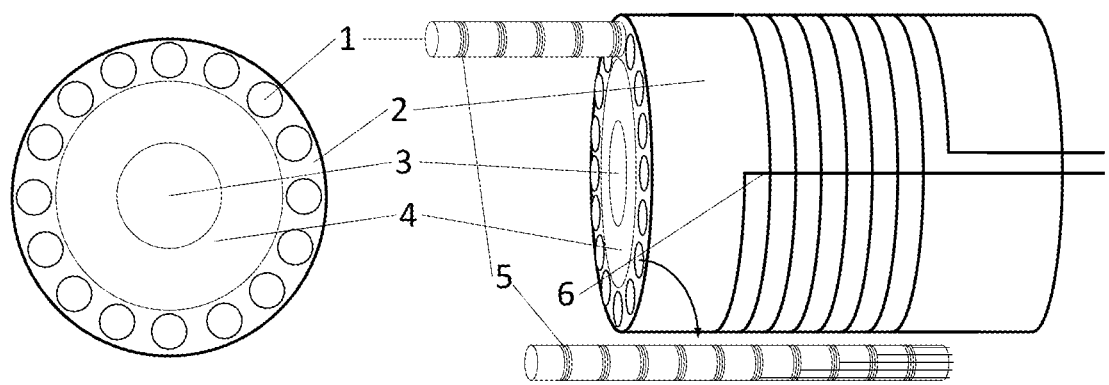
FIG. 1 is a diagram showing a design principle of a phase-controlled excitation downhole nuclear magnetic resonance imaging device in the present disclosure.

In the drawings, 1. cylindrical antenna system, 2. array antenna carrier, 3. slurry channel, 4. device frame, 5. array antenna unit, and 6. global antenna.

DETAILED DESCRIPTION OF THE INVENTION

In order to make objectives, technical solutions and advantages of the present disclosure clearer and more understandable, the present disclosure will be described in detail below in conjunction with the accompanying drawings and embodiments. It should be understood that the specific embodiments described herein are only intended to explain the present disclosure, rather than to limit the present disclosure. In addition, technical features related in each of implementations of the present disclosure described below may be combined with each other as long as there are no conflicts thereamong.

As shown in FIG. 1, the present disclosure provides a phase-controlled excitation downhole nuclear magnetic resonance imaging device, including cylindrical antenna systems 1, an array antenna carrier 2, a slurry channel 3, a device frame 4, array antenna units 5, and a global antenna 6. The cylindrical antenna systems 1 are uniformly arranged around a downhole nuclear magnetic resonance logging instrument and have the array antenna units 5 equidistantly mounted thereon. Each antenna unit in the array antenna units 5 is capable of achieving independent transmission and collection. The array antenna carrier 2 is of a frame structure for supporting the array antenna systems 1. The slurry channel 3 is a downhole channel for slurry circulation. The device frame 4 is of a torsion-resistant and pressure-bearing mechanical structure and is used for supporting the entire nuclear magnetic resonance imaging device. The array antenna units 5 are minimum antenna units for achieving phase-controlled excitation and reception. The global antenna 6 is used for achieving nuclear magnetic resonance excitation or signal collection in all areas around the nuclear magnetic resonance imaging device.

The device frame 4 is a cylindrical rod-like body made of a non-magnetic material, the center of an axis of the device frame is hollowed to form the slurry channel 3, the array antenna carrier 2 is tightly wrapped at the periphery of the device frame 4, the inside of the array antenna carrier 2 is provided with uniformly-distributed cavities for inserting the cylindrical antenna systems 1, the cylindrical antenna systems 1 are uniformly distributed and mounted with the array antenna units 5, the array antenna units 5 are assembled on the cylindrical antenna systems 1 in a winding manner, and the global antenna 6 is spirally wound on the array antenna carrier 2.

Figure 2:
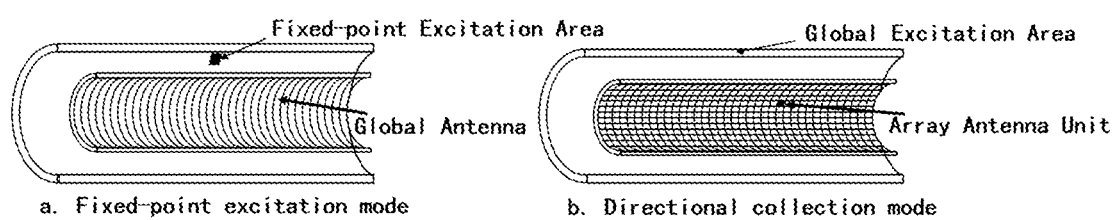
FIG. 2 is a diagram showing a principle of a phase-controlled excitation downhole nuclear magnetic resonance imaging method in the present disclosure, wherein Fig. a shows a fixed-point excitation mode, and Fig. b is a directional collection mode.

As shown in FIG. 2, the present disclosure provides a phase-controlled excitation downhole nuclear magnetic resonance imaging method mainly including a fixed-point excitation mode and a directional collection mode.

As shown in Fig. a in FIG. 2, in the fixed-point excitation mode, position points where a nuclear magnetic resonance phenomenon occurs around the nuclear magnetic resonance imaging device are achieved by controlling different phases of transmission pulses of the array antenna units 5 uniformly arranged on the cylindrical antenna systems 1. The collection of signals on the position points is achieved by means of the global antenna 6. By using a phase control technology, nuclear magnetic resonance data of each position point is obtained, and nuclear magnetic resonance imaging around a well is achieved. As shown in Fig. a and Fig. b in FIG. 2, a fixed-point excitation area and a global excitation area refer to areas where an antenna (including the array antenna units and the global antenna, and the antenna uses a transmitting function) transmits a pulse signal to cause a nuclear magnetic resonance phenomenon; and a collecting antenna refers to an antenna (including the array antenna units and the global antenna, and the antenna uses a receiving function) for receiving a nuclear magnetic signal.

As shown in Fig. b in FIG. 2, in the directional collection mode, a global excitation area is excited by adopting the global antenna 6 to generate a nuclear magnetic resonance phenomenon, echo signals are collected by using the array antenna units 5, and a weight in a receiving direction of each array antenna unit 5 is recognized according to distribution information of the array antenna units 5, so that the collection mode for imaging measurement is achieved.

By the above-mentioned specific embodiments, the present disclosure can achieve high-resolution imaging for an underground medium, and provides an important technical support for exploration and management work in related fields.

According to the present disclosure, a transmission phase of each antenna unit is controlled by adopting a phase control technology, the positioning excitation of a transmission pulse is achieved according to a co-phase stacking principle, and thus, the imaging resolution is further improved.

It is easily understood by the skilled in the art that the above description is only intended to show preferred embodiments of the present disclosure, rather than to limit the present disclosure. Any modifications, equivalent substitutions, improvements, etc. made without departing from the spirit and principle of the present disclosure shall fall within the protection scope of the present disclosure.

The invention claimed is:

1. A phase-controlled excitation downhole nuclear magnetic resonance imaging device, comprising cylindrical antenna systems, an array antenna carrier, a slurry channel, a device frame, array antenna units, and a global antenna; the cylindrical antenna systems being uniformly arranged around a downhole nuclear magnetic resonance logging instrument and having the array antenna units equidistantly and uniformly distributed thereon; each array antenna unit being capable of achieving independent transmission and collection; the device frame being a cylindrical rod-like body made of a non-magnetic material, the center of an axis of the device frame being hollowed to form the slurry channel, the array antenna carrier being tightly wrapped at the periphery of the device frame, the inside of the array antenna carrier being provided with uniformly-distributed cavities for inserting the cylindrical antenna systems; and the array antenna units being assembled on the cylindrical antenna systems in a winding manner, and the global antenna being spirally wound on the array antenna carrier.

2. The phase-controlled excitation downhole nuclear magnetic resonance imaging device of claim 1, wherein the array antenna carrier is of a frame structure for supporting the array antenna systems; the slurry channel is a downhole channel for slurry circulation; the device frame is of a torsion-resistant and pressure-bearing mechanical structure and is used for supporting the entire nuclear magnetic resonance imaging device; the array antenna units are minimum antenna units for achieving phase-controlled excitation and reception; and the global antenna achieves nuclear magnetic resonance excitation or signal collection in all areas around the nuclear magnetic resonance imaging device.

3. A nuclear magnetic resonance imaging method for the phase-controlled excitation downhole nuclear magnetic resonance imaging device of claim 1, comprising a fixed-point excitation mode and a directional collection mode; in the fixed-point excitation mode, position points where a nuclear magnetic resonance phenomenon occurs around the nuclear magnetic resonance imaging device being achieved by controlling different phases of transmission pulses of the array antenna units uniformly arranged on the cylindrical antenna systems, the collection of signals on the position points being achieved by means of the global antenna, the array antenna units being controlled by a phase control technology to transmit pulse signals of the different phases, and fixed-point nuclear magnetic resonance excitation being achieved on a set position by stacking the pulse transmission phases of the plurality of array antenna units, so that nuclear magnetic resonance data of each position point is obtained, and nuclear magnetic resonance imaging around a well is achieved; and in the directional collection mode, a global excitation area being excited by adopting the global antenna to generate a nuclear magnetic resonance phenomena, echo signals being collected by using the array antenna units, and a weight of a detected signal in a receiving direction of each array antenna unit being recognized according to position information of the array antenna units arranged on the cylindrical antenna systems, so that the directional collection mode for imaging measurement is achieved.

* * * * *